United States Patent
Arcoleo et al.

[11] Patent Number: 5,864,506
[45] Date of Patent: Jan. 26, 1999

[54] MEMORY HAVING SELECTABLE OUTPUT STRENGTH

[75] Inventors: Mathew R. Arcoleo, San Jose; Raymond M. Leong, Los Altos; Derek R. Johnson, Los Gatos, all of Calif.

[73] Assignee: Cypress Semiconductor Corporation, San Jose, Calif.

[21] Appl. No.: 6,772

[22] Filed: Jan. 14, 1998

[51] Int. Cl.[6] .................. G11C 16/04; H03K 19/0175
[52] U.S. Cl. .......................... 365/189.05; 365/230.06; 326/83
[58] Field of Search ............... 365/189.05, 230.06, 365/230.08; 326/21, 83; 327/108

[56] References Cited

U.S. PATENT DOCUMENTS

| | | | |
|---|---|---|---|
| 4,636,983 | 1/1987 | Young et al. | 365/181 |
| 4,785,427 | 11/1988 | Young | 365/189 |
| 4,877,978 | 10/1989 | Platt | 326/823 |
| 4,918,664 | 4/1990 | Platt | 365/230.05 |
| 5,132,936 | 7/1992 | Keswick et al. | 365/189.06 |
| 5,153,450 | 10/1992 | Ruetz | 326/37 |
| 5,157,282 | 10/1992 | Ong et al. | 326/27 |
| 5,162,672 | 11/1992 | McMahan et al. | 326/86 |
| 5,319,252 | 6/1994 | Pierce et al. | 307/263 |
| 5,319,258 | 6/1994 | Ruetz | 327/108 |
| 5,345,112 | 9/1994 | Nazarian et al. | 327/51 |
| 5,347,183 | 9/1994 | Phelan | 327/52 |
| 5,361,003 | 11/1994 | Roberts | 326/83 |
| 5,362,997 | 11/1994 | Bloker | 326/64 |
| 5,381,370 | 1/1995 | Lacey et al. | 365/200 |
| 5,383,157 | 1/1995 | Phelan | 365/201 |
| 5,444,406 | 8/1995 | Horne | 327/277 |
| 5,469,558 | 11/1995 | Lieberman et al. | 395/285 |
| 5,489,858 | 2/1996 | Pierce et al. | 326/83 |
| 5,512,854 | 4/1996 | Park | 327/374 |
| 5,561,792 | 10/1996 | Ganapathy | 395/550 |
| 5,583,457 | 12/1996 | Horiguchi et al. | 326/83 |
| 5,600,271 | 2/1997 | Erickson et al. | 327/108 |
| 5,708,597 | 1/1998 | Kelem | 365/230.03 |
| 5,732,027 | 3/1998 | Arcoleo et al. | 365/189.05 |

FOREIGN PATENT DOCUMENTS 0315473  5/1989  European Pat. Off. .

OTHER PUBLICATIONS

U.S. Patent Application Serial No. 08/576,081, entitled Method and Apparatus for a Programmable Skew Buffer to Optimize Input/Output Timing, by Mathew Arcoleo, filed on Dec. 21, 1995.

Griffin et al., *Memory 1996: Complete Coverage of DRAm, SRAM, EPROM, and Flash Memory ICs*, Chapter 7, "DRAM Technology," pp. 7–1 thru 7–20, Integrated Circuit Engineering Corporation, 1996.

Griffin et al., *Memory 1996: Complete Coverage of DRAM, SRAM, EPROM, and Flash Memory ICs*, Chapter 8, "SRAM Technology," pp. 8–1 thru 8–18, Integrated Circuit Engineering Corporation, 1996.

(List continued on next page.)

*Primary Examiner*—David Nelms
*Assistant Examiner*—Trong Phan

[57] ABSTRACT

An output buffer circuit of a semiconductor memory device can produce multiple output buffer drive strengths. An electronic system including a memory device in which such an output buffer circuit is implemented can include a mechanism for enabling the output buffer drive strength to be easily selected by a user of the memory device (such as an assembler of an electronic system including the memory device) from the multiple possible drive strengths. The invention thus enables a memory device to be easily configured to have an output buffer drive strength that is compatible with a wide variety of electrical loads to be driven by the output buffers of the memory device. Since the output buffer circuit of the invention allows the output buffer drive strength to be more closely tailored to the electrical load being driven, signal reflections, voltage overshoot and undershoot, and timing problems that can result from mismatch between the output buffer drive strength and the associated electrical load can be reduced.

20 Claims, 4 Drawing Sheets

OTHER PUBLICATIONS

Griffin et al., *Memory 1996: Complete Coverage of DRAM, SRAM, EPROM, and Flash Memory ICs,* Chapter 13, "Voltage and Power Consumption," pp. 13–1 thru 13–8, Integrated Circuit Engineering, Corporation 1996.

Cypress Semiconductor, *Cypress Programmable Logic Data Book 1996,* Nov. 1995, pp. i–v; 4–28 thru 4–34; and 6–16 thru 6–28.

Cypress Semiconductor, "Programmable Skew Clock Buffer (PSCB)," pp. 10–130 thru 10–139.

Cypress Semiconductor, *Cypress Data Book Memories DataCom FCT Logic PC Products,* May 1995, pp. i–iv, vii; 2–36 thru 2–43; 2–227; 2–258 thru 2–268; 6–1 thru 6–15; and 6–74 thru 6–84.

MEMORY HAVING SELECTABLE OUTPUT STRENGTH

BACKGROUND OF THE INVENTION

1. Field of the Invention

This invention relates to semiconductor memory devices and, in particular, to output buffers of such devices. Most particularly, the invention relates to a semiconductor memory output buffer circuit having a selectable drive strength.

2. Related Art

Currently, semiconductor memory devices such as static random access memories (SRAMs) are designed so that the output buffers associated with the memory cells of a memory device have a particular drive capability (or "drive strength"). (The drive strength when the memory cell provides a logic high signal can be different than that when the memory cell provides a logic low signal.) The drive strength of an output buffer determines the amount of current available to switch the output signal from the output buffer from one state to another (i.e., from a logic high signal to a logic low signal, and vice versa), as well as the steady-state amount of current that can be supplied from the output buffer.

Memory devices can be interconnected with a variety of other electrical circuits and/or components ("receiving devices") to which the data stored in the memory device can be provided. Moreover, these receiving devices can be interconnected with a memory device in a variety of ways. Consequently, the electrical load which must be driven and switched by the output signal from an output buffer of a memory device can vary widely, depending on the particular characteristics of the receiving device and the characteristics of the interconnection between the memory device and the receiving device.

As can be appreciated, the drive strength of the output buffers of a memory device may not be appropriately matched (i.e., the drive strength may be too strong or too weak) with the electrical load presented at the output nodes of the output buffers. For example, SRAMs have typically been used in systems of electrical and/or electronic devices ("electronic systems") in which the output buffers of the SRAM were designed to drive and switch an electrical load that could be represented as a lumped capacitive load. In many current electronic systems, however, SRAMs must drive and switch electrical loads that are more accurately modelled as distributed capacitive loads (i.e., as transmission lines), rather than as lumped capacitive loads, thus necessitating output buffers having different drive characteristics.

In short, no single output buffer drive strength is appropriate for all electrical loads that an output buffer may be required to drive. For example, if the drive strength of an output buffer driving a transmission line electrical load is too strong, the impedance of the output buffer can be low enough to produce an impedance mismatch between the output buffer and the transmission line electrical load that is of sufficient magnitude to cause signal (current and voltage) reflections in the transmission line during switching. If the output buffer drive strength becomes too large, these reflections can become large enough to induce sufficient noise in the receiving device to produce failure of the electronic system of which the memory device is part ("system failure"). Further, when driving a lumped capacitive electrical load, an output buffer having a drive strength that is too large can cause excessive voltage overshoots and/or undershoots at the input buffer of the receiving device during switching. These overshoots and undershoots can also result in system failure by, for example, causing a spurious change in logic state or producing excessive noise in other devices of the electronic system (that can, in extreme cases, damage those devices). If, on the other hand, the output buffer drive strength is too small, then the data can be supplied from the memory device to the receiving device more slowly than desired, perhaps sufficiently slowly to fail to meet the timing requirements of the receiving device and thereby cause system failure.

FIG. 1 is a block diagram of a memory cell 101 and associated output buffer 102. The output buffer 102 accepts an input signal (e.g., a voltage having a particular magnitude) from the memory cell 101 at the node 103. In response to the input signal, the output buffer 102 produces an output signal (e.g., a voltage having a particular magnitude) at the node 104 that represents an input signal to a receiving device or devices.

FIG. 2A is a schematic diagram of a typical simple implementation of the output buffer 102 in which the output buffer 102 is embodied by an inverter 201. As shown in FIG. 2B, the inverter 201 can be implemented by a P-channel transistor 202 connected in series with an N-channel transistor 203 between a supply voltage and a ground voltage. In the implementation shown in FIG. 2B, the drive strength depends upon the physical characteristics of the transistors 202 and 203, only one of which is operating at any given time. Thus, as can be appreciated, in the typical output buffer implementation shown in FIG. 2B, the output buffer can have only a single drive strength when either a logic high signal or a logic low signal is received at node 103.

Previously, if a particular type of semiconductor memory device was found to have an output buffer drive strength that was incompatible with a receiving device or devices to which the memory device was to be interconnected, other types of semiconductor memory devices (e.g., memory devices made by other manufacturers) were substituted for the incompatible memory device until a memory device having an acceptable output buffer drive strength was found. However, this "solution" is inadequate if only one or a small number of memory devices are acceptable for an application because then the number of sources of memory devices for that application is undesirably limited.

Another approach has been to place a resistor between the output buffer and the receiving device. FIG. 3 is a block diagram illustrating this approach. A resistor 301 is placed between the output buffer 102 of FIG. 1 and an input buffer 302 of a receiving device. The resistor 301 reduces the current sourced to or from the output buffer 102, thus decreasing voltage overshoot and undershoot that can occur when an output buffer having an overly strong drive strength drives a lumped capacitive load. However, the addition of such a resistor adds cost to the overall electronic system. Further, if the need for such a resistor is identified after the circuit design of an electronic system has been established (e.g., during testing of the electronic system), the addition of such a resistor at that late stage may be impracticable. Moreover, the presence of such a resistor can aggravate impedance mismatching when such a strong output buffer drives a transmission line load. Additionally, the use of such a resistor does not help when the output buffer drive strength is too weak for the electrical load to be driven: in fact, the use of such a resistor exacerbates the problem of slow switching attendant an overly weak output driver.

In view of the above, it would be desirable to provide in a semiconductor memory device an output buffer circuit in which the output buffer drive strength can be varied to accommodate a variety of electrical loads. It would also be desirable to enable a user of a memory device (e.g., an assembler of an electronic system including the memory device) including such an output buffer circuit to easily select a desired output buffer drive strength.

While output buffers having selectable drive strength have previously been used with other devices, such as programmable logic devices, selectable drive strength output buffers that allow a user to adjust the output buffer drive strength have not heretofore been used with semiconductor memory devices. There are several reasons for this. First, in previous memory chips (i.e., packaged integrated circuits embodying a memory device), there have not been package leads available for inputting a control signal or signals to effect the selection of the output buffer drive strength. Moreover, programmable logic devices by their nature include a programming capability, which capability can be extended to use with output buffers; memory devices, on the other hand, have not included such capability. Second, in designing electronic systems including memory devices (e.g., personal computers), the compatibility of the memory device's output buffer drive strength with the requirements of a receiving device or devices that receive data from the memory device has not been a significant concern, since, in many cases, the degree of whatever incompatibility exists (e.g., the magnitude of the voltage undershoot and overshoot) can be tolerated. For example, the clock frequency of previous electronic systems has been relatively low (e.g., 200 MHz microprocessors are now being used in personal computers that not long ago would have used a 33 MHz microprocessor), thus allowing a longer time for an output signal from a memory device to stabilize (e.g., for voltage undershoot and overshoot to dissipate) before that signal is latched into a receiving device. Third, in a semiconductor memory device, it is typically desirable to use as high a percentage of area as possible for the memory cells, while keeping to a minimum the area used for peripheral circuitry such as output buffers, so that the memory device can be made as small as possible, thus reducing the cost per unit of memory capacity.

SUMMARY OF THE INVENTION

According to the invention, an output buffer circuit of a semiconductor memory device can produce multiple output buffer drive strengths. An electronic system including a memory device in which such an output buffer circuit is implemented can include a mechanism for enabling the output buffer drive strength to be easily selected by a user of the memory device (such as an assembler of an electronic system including the memory device) from the multiple possible drive strengths. (Typically, the drive strength of all output buffers of the memory device is established by such user selection.) The invention thus enables a memory device to be easily configured to have an output buffer drive strength that is compatible with a wide variety of electrical loads (e.g., loads having different magnitudes or different electrical characteristics) to be driven by the output buffers of the memory device, i.e., the output buffer drive strength can be tailored to accommodate a wide variety of receiving devices (devices to which the data stored in the memory device can be provided) and types of interconnection to receiving devices. A memory device including an output buffer circuit in accordance with the invention is thus more versatile (i.e., can be used in a wider variety of applications) than previous memory devices.

The output buffer circuit of the invention allows the output buffer drive strength to be more closely tailored to the electrical load being driven. This reduces or eliminates signal reflections, voltage overshoot and undershoot, and timing problems that can result from mismatch between the output buffer drive strength and the associated electrical load. The importance of minimizing such problems is increasing with new generations of electronic systems. For example, the increasing use of low power electrical devices (e.g., supply voltage of 3.3 volts) increases the importance of minimizing voltage overshoot and undershoot during switching to a logic high state, since, for those devices, a given magnitude of voltage overshoot or undershoot has a greater magnitude relative to the magnitude of the voltage representing the logic high state. The increased importance of minimizing the above-described signal distortions provides greater motivation to allot area in a semiconductor memory device for formation of an output buffer circuit that provides selectable drive strength, even if at the expense of available area for forming memory cells or other circuitry of the memory device.

Moreover, the increasing use of memory chips with relatively high numbers of package leads increases the likelihood that one or more package leads are available for inputting a control signal or signals to the memory device within the memory chip to enable selection of an output buffer drive strength. Thus, the output drive strength selectability provided by the invention can be implemented with current and future generations of memory chips so as to enable a user to easily select a desired drive strength.

In one embodiment of the invention, an output buffer circuit includes: i) a mechanism for producing an output signal at an output node of the output buffer circuit in response to an input signal from a memory cell received at an input node of the output buffer circuit, and ii) a mechanism for selectably controlling current flow through the mechanism for producing an output signal to thereby control and/or select the output signal. The mechanism for producing an output signal can further include first and second current control mechanisms for providing current to or from the output node in response to the received input signal, the first and second current control mechanisms being connected or connectable in parallel between the input node and output node. The mechanism for selectably controlling can further include a mechanism for operably connecting the first and/or second current control mechanisms to the input and output nodes in response to a control signal to enable the operably connected current control mechanisms to provide current to the output node. The first and second current control mechanisms can be, for example, inverters, which can, in turn, each be embodied by, for example, an N-channel transistor and a P-channel transistor connected in series between a supply voltage and a ground voltage. In the latter case, the mechanism for operably connecting the first and/or second current control mechanisms to the input and output nodes in response to a control signal can further include: i) a first switching transistor connected in series with the N-channel transistor of the first or second current control mechanism between the output node and the ground voltage; and ii) a second switching transistor connected in series with the corresponding P-channel transistor of the first or second current control mechanism between the output node and the supply voltage.

In another embodiment of the invention, a system for selectably controlling the drive strength of an output buffer includes: i) a memory cell; ii) an output buffer circuit adapted to receive an input signal from the memory cell and to provide an output signal, the output buffer circuit including a mechanism for producing the output signal in response to the received input signal, and a mechanism for selectably controlling the current flow through the mechanism for producing the output signal; and iii) a mechanism for operating the mechanism for selectably controlling in accordance with a control signal. In a further embodiment, the system further includes a mechanism for generating a control signal. The mechanism for generating a control signal can further include a mechanism for establishing a voltage of predetermined magnitude, such as, for example, a resistor configured to couple a predetermined voltage to the mechanism for selectably controlling. The mechanism for generating a control signal can also further include a mechanism for generating a series of signals that can be stored by the system, wherein the series of signals are generated at a predetermined time and/or are uniquely identifiable.

In still another embodiment of the invention, a method for acquiring data stored in a memory device includes the steps of: i) receiving an input signal representing data stored in a memory cell of the memory device; and ii) selectably controlling a current flow in response to the signal to produce an output signal that represents the data stored in the memory cell.

In the detailed description of the invention below, a selectable drive strength output buffer circuit is described that represents a modification of a relatively simple single drive strength output buffer circuit. However, the principles of the invention can be used to construct an output buffer circuit having selectable drive strength based upon a previously known single drive strength output buffer circuit of any complexity and including any functional components.

The invention can be implemented with any type of memory device, such as, for example, SRAM, PSRAM, DRAM, PROM, EPROM, EEPROM, flash memory, FIFO memory and content addressable memory (CAM). Moreover, the invention is appropriate for implementation in memory devices used in a wide variety of applications, including, for example, personal computers and data communications systems. Aspects of the invention can also be implemented with other devices, including, for example, logic devices (such as, for example, PLDs, CPLDs and FPGAs), microcontrollers, and data communications devices (such as, for example, transmitters, receivers, transceivers, translators and interface circuits). Moreover, the invention can be implemented in devices that include a combination of the above devices (e.g., a device including a combination of the functionality of a memory device and a logic device).

DETAILED DESCRIPTION OF THE INVENTION

Figure 1:
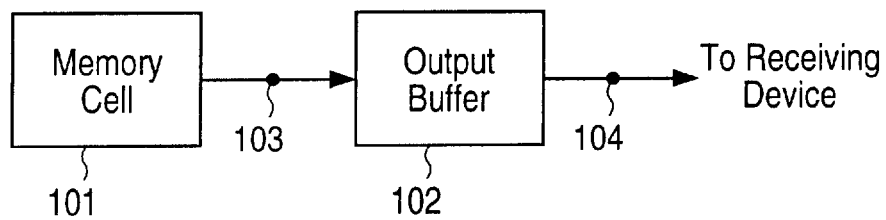
FIG. 1 is a block diagram of a memory cell and associated output buffer.
Figure 2A:
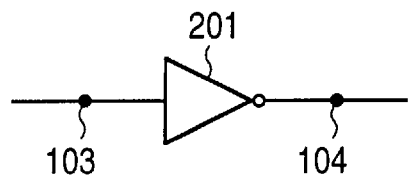
FIGS. 2A and 2B are schematic diagrams of an implementation of the output buffer of FIG. 1 as a conventional inverter.
Figure 2B:
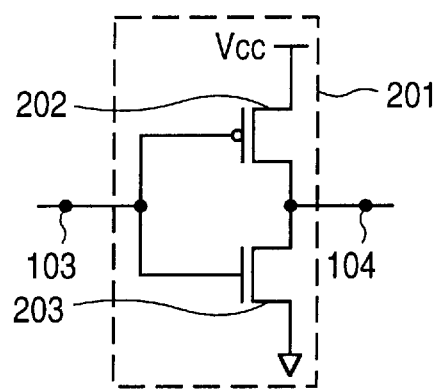
Figure 3:
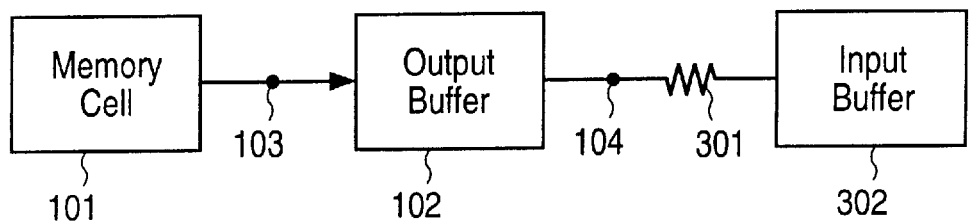
FIG. 3 is a block diagram illustrating the addition of a resistor between a memory cell output buffer and an input buffer of a receiving device to which an output signal from the output buffer is being transmitted, the resistor reducing voltage overshoot and undershoot at the input buffer of the receiving device.
Figure 4:
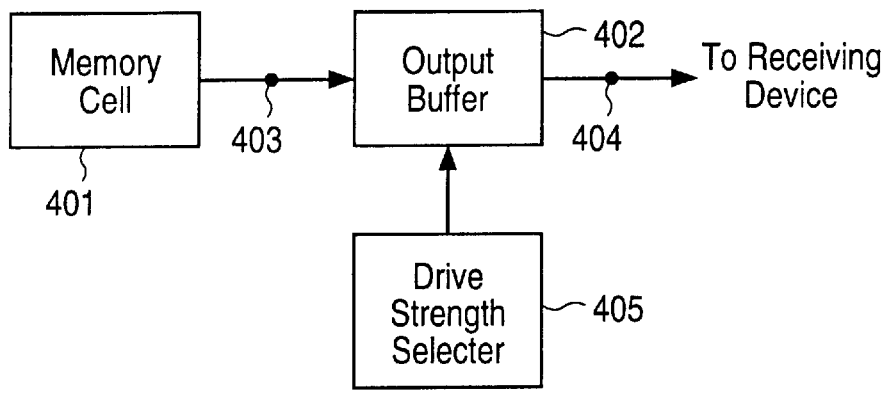
FIG. 4 is a block diagram illustrating a memory cell and an output buffer circuit according to the invention.

FIG. 4 is a block diagram illustrating a memory cell and an output buffer circuit according to the invention. A memory cell 401 provides a signal representing data stored in the memory cell 401 as an input signal (e.g., a voltage having a particular magnitude) to the output buffer 402 at node 403 ("input node"). In response to the input signal, the output buffer 402 produces an output signal (e.g., a voltage having a particular magnitude) at the node 404 ("output node"), the produced output signal representing an input signal to an interconnected receiving device or devices. An output buffer drive strength selecter 405 enables control of the operation of the output buffer 402 so that the output buffer 402 has a selected one of a set of possible output buffer drive strengths (i.e., a desired amount of current is flowed to the output node 404), and can thereby control the output signal provided from the output buffer 402 at the output node 404. The drive strength selecter 405 can enable a user of a memory device including a memory cell and output buffer circuit as shown in FIG. 4 to specify a desired output buffer drive strength, as described in more detail below. In particular, the drive strength selecter 405 can be embodied so that the user selectability is enabled by establishing a control signal external to the memory device and inputting the control signal to the memory device. In other words, the invention enables "off-chip" selectability of the output buffer drive strength of a semiconductor memory device.

Figure 5A:
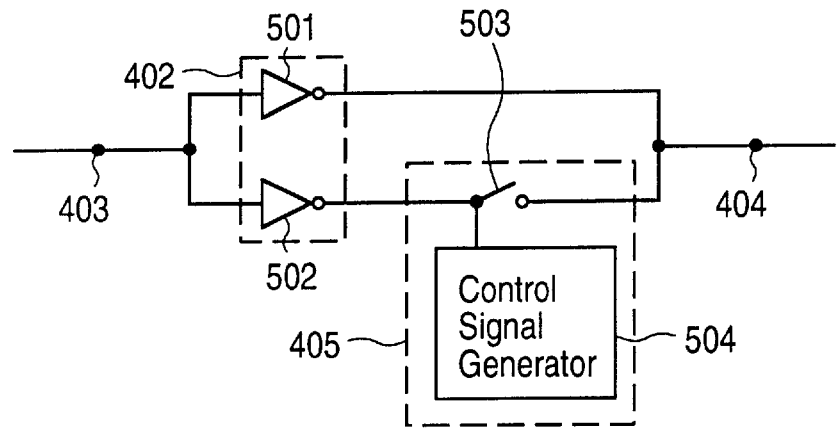
FIGS. 5A and 5B are schematic diagrams illustrating one embodiment of an output buffer circuit according to the invention.
Figure 5B:
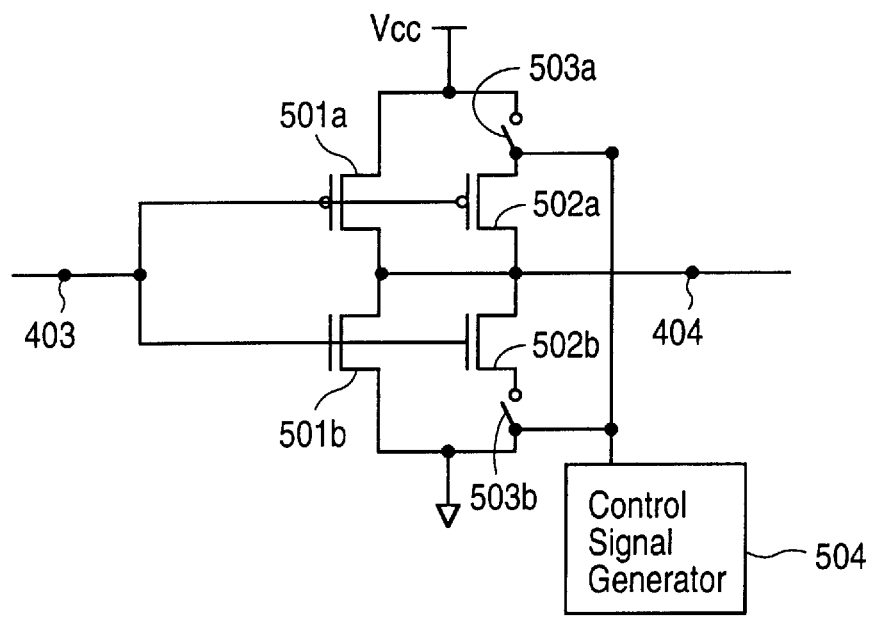

FIGS. 5A and 5B are schematic diagrams illustrating one embodiment of an output buffer circuit according to the invention. As shown in FIG. 5A, in this embodiment, the output buffer 402 of the output buffer circuit shown in FIG. 4 is implemented by inverters 501 and 502 that are connected (or connectable) in parallel between the input node 403 and the output node 404. The inverter 501 is always operably (i.e., so as to receive or transmit current) connected to both the input node 403 and the output node 404 so that the inverter 501 sources current to or from the output node 404 whenever an input signal is received by the input node 403. The output buffer drive strength selecter 405 of the output buffer circuit is implemented by a control signal generator 504 and a switch 503, the former controlling the latter to operably connect or disconnect the inverter 502 to the output node 404. If the inverter 502 is operably connected to the output node 404, then the inverter 502 can source current to or from the output node 404 whenever an input signal is received by the input node 403 so that both inverters 501 and 502 are sourcing current in parallel, thereby enabling more current to be sourced to or from the output node 404 than when only the inverter 501 is operably connected to the output node 404. If the inverter 502 is not operably connected to the output node 404, then only the inverter 501 sources current to or from the output node 404 in response to the receipt of an input signal by the input node 403. As can be seen, then, the control signal generator 504 can control the output buffer drive strength of the output buffer 402.

FIG. 5B illustrates a more detailed particular embodiment of the circuit of FIG. 5A in which the inverters 501 and 502 are each implemented by a P-channel pull-up transistor (transistors 501a and 502a, respectively) connected in series with an N-channel pull-down transistor (transistors 501b and 502b, respectively) between a supply voltage and a ground voltage. The gate of each of the transistors 501a, 501b, 502a and 502b is electrically connected to the input node 403, so that an input signal received at the input node 403 can control the current flow through the transistors 501a, 501b, 502a and 502b, thereby producing a predictable output signal at the output node 404, as described in more detail below. In this particular embodiment, the switch 503 is implemented as two switches 503a and 503b: the switch 503a operably connects or disconnects the pull-up transistor 502a to the supply voltage (thereby operably connecting the pull-up transistor 502a to the output node 404) and the switch 503b operably connects or disconnects the pull-down transistor 502b to the ground voltage (thereby operably connecting the pull-down transistor 502b to the output node 404). (The switches 503a and 503b could have been located between the output node 404 and the respective transistors 502a and 502b with the same effect.) Generally, the switch 503 (and switches 503a and 503b) can be implemented in any appropriate manner; one particular way is described below with respect to FIG. 6.

When a logic high voltage is output from the memory cell 401 (FIG. 4) to the input node 403 of the output buffer circuit, the N-channel pull-down transistor 501b is turned on and sources current from the output node 404 to the ground voltage, thus producing a logic low voltage at the output node 404. The N-channel pull-down transistor 502b is also turned on by a logic high voltage at input node 403; however, when the switch 503b is open, the transistor 502b cannot source current from the output node 404 to the ground voltage. (The P-channel pull-up transistors 501a and 502a are turned off.) If it is necessary or desirable to more rapidly source current from the output node 404 (thereby more rapidly establishing the logic low voltage at the output node 404), i.e., increase the drive strength of the output buffer, the control signal generator 504 can be caused to transmit a signal that closes the switch 503b, thereby enabling the transistor 502b to source current from the output node 404 to the ground voltage. (The switch 503a may or may not be closed synchronously with the switch 503b; in an implementation of the switches 503a and 503b consonant with the embodiment of the invention described with respect to FIG. 6, it would be. In any event, the operation of the switch 503a does not affect the operation of the output buffer circuit as now being described.) As can be appreciated, transistors 501b and 502b can source more current in parallel than the transistor 501b can source alone; thus, the drive strength of the output buffer is increased.

Similarly, when a logic low voltage is output from the memory cell 401 (FIG. 4) to the input node 403 of the output buffer circuit, both of the P-channel pull-up transistors 501a and 502a are turned on so that current can be sourced from the supply voltage to the output node 404, thus producing a logic high voltage at the output node 404. (The N-channel pull-down transistors 501b and 502b are turned off.) However, if the switch 503a is open, only the transistor 501a sources current from the supply voltage to the output node 404. In similar manner to that described above, if it is necessary or desirable to more rapidly source current to the output node 404 (thereby more rapidly establishing the logic high voltage at the output node 404), the control signal generator 504 can be caused to transmit a signal that closes the switch 503a, thereby enabling the transistor 502a to source current to the output node 404, thus increasing the drive strength of the output buffer.

The output buffer circuits illustrated in FIGS. 5A and 5B are configured to provide two possible output buffer drive strengths. Generally, according to the invention, any number of possible output buffer drive strengths can be provided. The multiple drive strengths can be provided, for example, by appropriately extending the general principle of the output buffer circuits of FIGS. 5A and 5B, i.e., by providing multiple inverters, each of which can be responsive to an input signal to produce an output signal, one or more of which can be switched on or off to enable or disable operation of the inverter (see, for example, the output buffer circuit of FIG. 6, described below, in which three possible output buffer strengths are provided).

As can be readily appreciated by those skilled in the art, the particular magnitudes of the output buffer drive strengths (i.e., the amount of current that can be sourced to or from the output node 404) produced by the output buffer circuits of FIGS. 5A and 5B are dependent upon the physical characteristics of the inverters 501 and 502. In particular, in the output buffer circuit of FIG. 5B, the drive strengths are determined by the physical characteristics (e.g., length, width, capacitance, channel resistance) of the transistors 501a, 501b, 502a and 502b. Thus, by appropriately selecting the physical characteristics of the transistors 501a, 501b, 502a and 502b, the possible drive strength magnitudes can be predictably established.

As indicated elsewhere herein, the principles of the invention can be used to enable selectable drive strength in output buffer circuits that are more complex than that shown in FIGS. 5A and 5B. As known by those skilled in the art, such output buffer circuits can include many more, and different types of, circuit components than are shown in the output buffer circuits of FIGS. 5A and 5B. In such output buffer circuits, different drive strengths can be obtained by varying the physical characteristics of other types of devices that are included in the output buffer circuit. For example, a single resistor and/or capacitor might be replaced by multiple corresponding resistors and/or capacitors, respectively. Multiple drive strengths could be enabled by sizing the resistors or capacitors differently (i.e., by providing multiple resistors and/or capacitors that each have different resistances or capacitances, respectively) and/or by operably connecting a variable number of the resistors and/or capacitors to the remainder of the output buffer circuit (in a manner similar to that described elsewhere herein for operably connecting inverters to the output buffer circuit).

Figure 6:
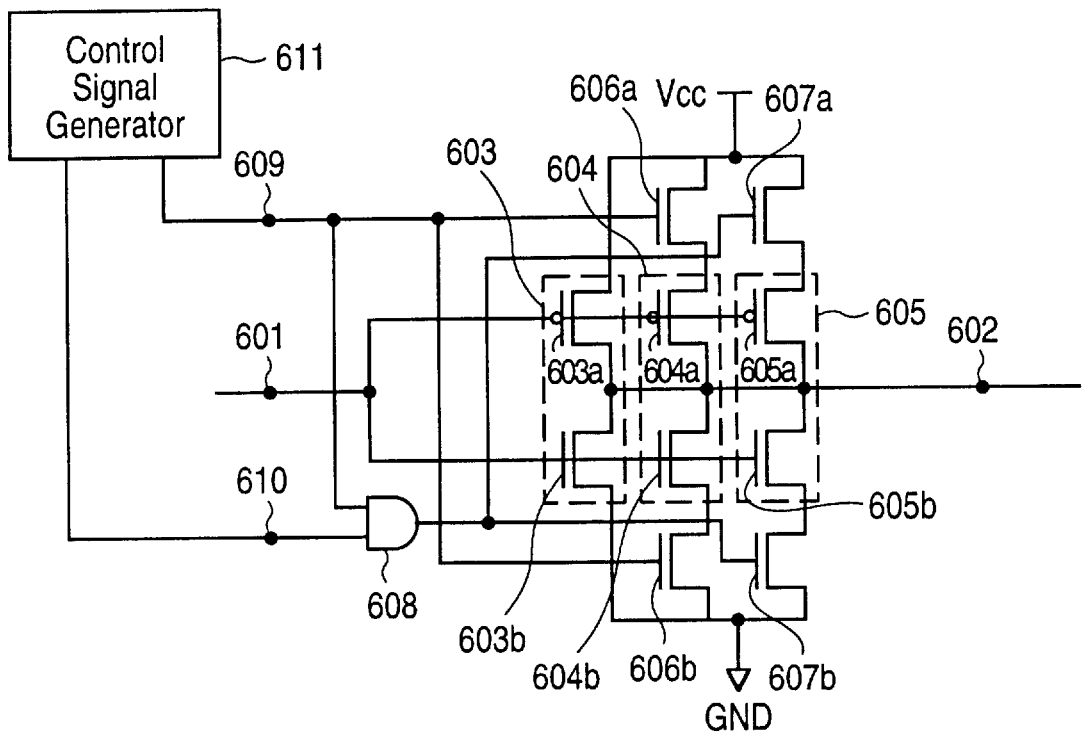
FIG. 6 is a schematic diagram illustrating another embodiment of an output buffer circuit according to the invention.

FIG. 6 is a schematic diagram illustrating another embodiment of an output buffer circuit according to the invention. This output buffer circuit enables selection of one of three possible output buffer drive strengths. The output buffer circuit shown in FIG. 6 also illustrates how a switch of a drive strength selecter can be implemented.

The output buffer circuit of FIG. 6 includes three inverters 603, 604 and 605, each of which are implemented by a P-channel pull-up transistor (transistors 603a, 604a and 605a, respectively) connected in series with an N-channel pull-down transistor (transistors 603b, 604b and 605b, respectively) between a supply voltage and a ground voltage. The gate of each of the transistors 603a, 603b, 604a, 604b, 605a and 605b is electrically connected to the input node 601, so that an input signal received at the input node 601 controls the current flow through the transistors 603a, 603b, 604a, 604b, 605a and 605b to produce a predictable output signal at the output node 602, as described above.

In FIG. 6, the data from the memory cell is received as an input signal at the input node 601. In the same manner as described above, a logic high voltage at the input node 601 turns the N-channel transistors 603b, 604b and 605b on and the P-channel transistors 603a, 604a and 605a off so that current is sourced from the output node 602 to the ground voltage, thus producing a logic low voltage at the output node 602. Similarly, a logic low voltage at the input node 601 turns the P-channel transistors 603a, 604a and 605a on and the N-channel transistors 603b, 604b and 605b off so that current is sourced to the output node 602 from the supply voltage, thus producing a logic high voltage at the output node 602.

Whenever an input signal (i.e., a logic high voltage or a logic low voltage) is received at the input node 601, one of the transistors 603a or 603b is turned on and sources current to or from the output node 602. This provides a default drive strength, which, in the circuit of FIG. 6, also happens to be the weakest drive strength. Each of the inverters 604 and 605 can be switched on or off to enable one of the transistors of the inverter 604 and/or 605 to source current, thereby producing increased drive strength of the output buffer. If both of the inverters 604 and 605 are switched on, the strongest output buffer drive strength is obtained. An intermediate drive strength is obtained by switching on only one of the two additional inverters 604 and 605 (the inverter 604, in the output buffer circuit configured as shown in FIG. 6).

In the output buffer circuit shown in FIG. 6, the switching on and off of the two additional inverters 604 and 605 is accomplished by the N-channel transistors 606a and 606b, and 607a and 607b, respectively. A control signal generator 611 is used to transmit control signals to the nodes 609 and 610. If a logic low voltage is transmitted to each of the nodes 609 and 610, all of the transistors 606a, 606b, 607a and 607b are turned off and only the transistors 603a and 603b can source current to or from the output node 602 (weakest drive strength). If a logic high voltage is applied to the node 609 and a logic low voltage is applied to the node 610, the transistors 606a and 606b are turned on and the transistors 607a and 607b are turned off (the AND gate 608 produces a logic low voltage at the gate of the transistors 607a and 607b), so that current can be sourced to or from the output node 602 through the two inverters 603 and 604 (intermediate drive strength). If a logic high voltage is applied to both nodes 609 and 610, all of the transistors 606a, 606b, 607a and 607b are turned on (the AND gate 608 now produces a logic high voltage at the gate of the transistors 607a and 607b), so that current can be sourced to or from the output node 602 through all of the inverters 603, 604 and 605 (strongest drive strength).

The control signal or signals used to specify a desired output buffer drive strength can be established in any appropriate way that enables the control signal or signals to be input to a completed memory device of which the output buffer circuit of the invention is a part. In other words, the manner of establishing the control signal or signals is not part of the process of fabricating the memory device. The control signal or signals are established based upon a drive strength specification provided by a user. The invention can be implemented, for example, so that this specification is made during assembly of the memory device into an electronic system, or at a predetermined time during operation of the memory device (e.g., when the memory device is powered up). Several illustrative possibilities for establishing the control signal or signals are discussed below; others can be used.

If a packaged integrated circuit embodying a memory device ("memory chip") in accordance with the invention includes unused package leads, one or more of these package leads can be used to accept the control signal or signals as an input to the memory chip. For example, when the memory device includes an output buffer circuit as in FIG. 6 above, a single package lead could be used to specify one of the three possible drive strengths as follows.

Figure 7:
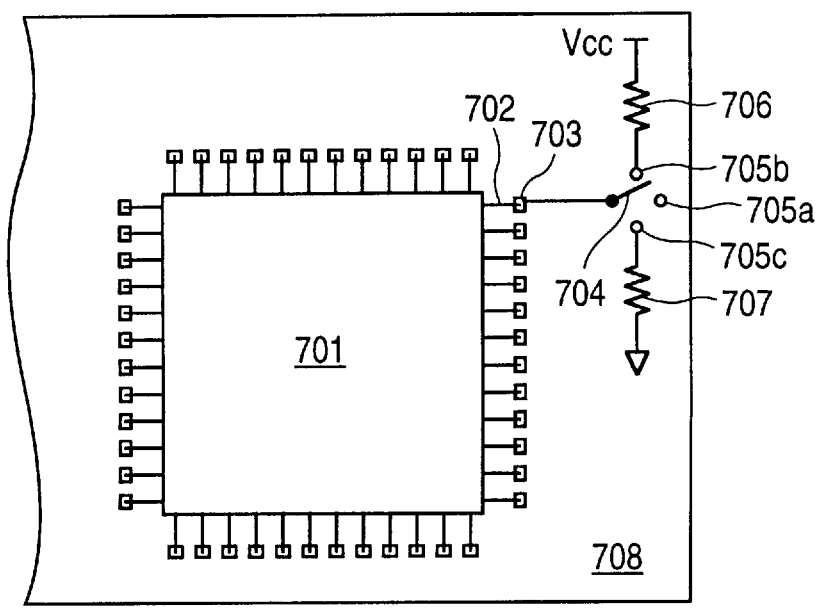
FIG. 7 is a simplified plan view of a memory chip in accordance with the invention mounted on a printed circuit board, illustrating one mechanism in accordance with the invention for enabling specification of a control signal that establishes a desired output buffer drive strength in an output buffer circuit according to the invention.

FIG. 7 is a simplified plan view of a memory chip 701 mounted on a printed circuit board 708. A multiplicity of package leads (e.g., package lead 702) extend from the memory chip 701 and are mechanically and electrically connected to corresponding pads (e.g., pad 703) on the printed circuit board 708. Within the memory chip 701, the package lead 702 is connected to circuitry on the memory device that supplies the control signal to one or more output buffer circuits according to the invention. Conceptually, a switch 704 can be positioned in one of three positions to electrically connect the pad 703 to one of the terminals 705a, 705b or 705c. (A practical way of implementing such switching is discussed below.) When the switch 704 makes connection to the terminal 705a (or, in fact, is in any position other than one in which contact is made to the terminal 705b or 705c), no control signal is sent via the package lead 702 into the memory chip 701. The output buffer circuit can be configured so that when this occurs, a default output buffer drive strength is selected. The default drive strength may be, for example, an intermediate drive strength (this can be implemented with the output buffer circuit of FIG. 6 with slight modification to that output buffer circuit as readily understandable to those skilled in the art). When the switch 704 makes connection to the terminals 705b and 705c, respectively, logic high and logic low voltages are established by the pull-up resistor 706 and pull-down resistor 707, respectively. The logic high and logic low voltages can be control signals that cause appropriate logical signals to be transmitted via the package lead 702 to the nodes 609 and 610 (FIG. 6) to specify, alternatively, a weak drive strength or a strong drive strength in the manner described above with respect to FIG. 6 (again, this would require slight modification to the output buffer circuit of FIG. 6, as readily understandable to those skilled in the art).

In FIG. 7, the switching can be implemented by placing a resistor (e.g., a strap resistor) on the printed circuit board 708 to make connection between the pad 703 and a supply voltage on the printed circuit board 708 (i.e., connecting to node 705b in FIG. 7), placing a resistor on the printed circuit board 708 to make connection between the pad 703 and a ground voltage on the printed circuit board 708 (i.e., the switch 704 is connected to node 705c in FIG. 7), or not placing any resistor on the printed circuit board 708 (i.e., the switch 704 is connected to node 705a in FIG. 7). Thus, an assembler of an electronic system including the memory chip 701 can easily select the desired output buffer drive strength for the memory device within the chip 701. In particular, the above-described approach can be advantageous because it allows the assembler to "select" the default drive strength by doing nothing (i.e., not placing a resistor on the printed circuit board 708).

It can be readily understood that as many control signals as necessary can be established using resistors in a wide variety of ways similar to the one described above by, for example, connecting resistors to other terminals (i.e., voltage levels) on the printed circuit board 708 or using resistors having different resistance values. For example, in FIG. 7, resistors could be connected both between the pad 703 and the supply voltage, and between the pad 703 and the ground voltage, thus providing a voltage divider that establishes voltage level intermediate that established by connecting either of the resistors alone. Additionally, more than one package lead could be used to transmit control signals in a manner similar to that described above.

If a memory chip does not have an available package lead that can be dedicated to transmitting a control signal for selecting the output buffer drive strength, it can be useful to make temporary use of a package lead or leads that normally serve another purpose. A series of signals can be transmitted to the memory device via a predetermined lead or leads to "program" the memory device with the desired drive strength. For example, a series of signals can be transmitted via a predetermined lead or leads at a predetermined time. Or, a series of "uncommon" signals can be transmitted via a predetermined lead or leads at any time. Each possible drive strength can be associated with a particular series of signals so that, depending on the series of signals transmitted, a register or registers can be set, for example, in the memory device to identify a specified drive strength.

For example, a particular package lead could be monitored during power up of the memory device, the sequence of signals being transmitted over that lead establishing a drive strength select (or program) signal. The drive strength select signal may be generated in response to application of a threshold power, voltage or current to the device (the so-called "power-up" or "power-on" condition). In one embodiment, a sequence of pulses from (or transitions of) signals received at a dedicated pin or pad (e.g., chip enable and output enable signals) occurring at or shortly after "power-on" may be input into a conventional latch circuit configured to generate a select signal for the desired drive strength in response to a particular pulse sequence. (For examples of such circuits, see U.S. Pat. No. 5,434,819 and the copending, commonly owned, U.S. patent application entitled "Method and Circuit for Entering a Test Mode," filed on Dec. 23, 1996 and having Ser. No. 08/774,293, the relevant disclosures of which are incorporated by reference herein.) In further embodiments, the latch circuit may also receive signals corresponding to other parameters and/or their associated states or values, such as input voltage and feedback current, before generating the drive strength select signal. Where the drive strength select signal is to be generated from such additional parameters, additional logic may be advantageously employed to convert the parameter state or value into a binary logic signal.

Alternatively, in response to a series of voltages that are outside the normal operating voltages in the memory device (e.g., a voltage of 7 volts when the supply voltage is 5 volts), a control signal may be generated to program the output buffer circuit and/or select the drive strength. It may be advantageous, however, to avoid using a set of programming conditions that might be unintentionally duplicated during operation of the memory device and spuriously program or re-program the output buffer drive strength.

The above examples are merely illustrative of the ways in which a desired output buffer drive strength could be programmed into a memory device. Those skilled in the art will readily appreciate that such programmability could be implemented in many other ways.

It is also possible to use resistors in the manner described above with respect to FIG. 7, but that are connected to a pad to which connection is made by a package lead that is not dedicated to the output buffer drive strength control signal. Such connections could be made to multiple package leads. At a predetermined time (e.g., during power up), the signal on such leads is latched within the memory device. The latched set of signals is then used, according to a predetermined scheme, to establish the output buffer drive strength. At times other than the predetermined time, the leads are used for other purposes.

The above discussion of implementation of the user selectability aspect of the invention has focused on the capability of an assembler of an electronic system including a memory device in accordance with the invention to establish an output buffer drive strength as part of assembling the electronic system. However, it is also possible to implement an appropriate user interface that enables a user of the electronic system (e.g., a computer user) to specify a desired output buffer drive strength.

Above, the selective use of inverting pairs of transistors to vary the drive strength of an output buffer is described. In a further embodiment of the invention, capacitors and/or resistors can be added to, or removed from, the output buffer circuit, thus changing the rate at which current is sourced by the transistors and, therefore, the rate at which the output signal produced by the output buffer changes (i.e., the switching speed of the output signal). The overall drive capabilities (i.e., the magnitudes of each of the drive strengths) of the output buffer would remain the same.

The invention has been described above as implemented in a relatively simple output buffer circuit, i.e., a single inverter output buffer has been modified to include multiple selectable inverters. The invention can also be implemented in more complicated output buffer circuits; those skilled in the art of output buffer circuit design will readily appreciate how the principles of the invention, as illustrated above, can be used to construct an output buffer circuit having selectable drive strength based upon a previously known single drive strength output buffer circuit of any complexity and including any functional components.

Various embodiments of the invention have been described. The descriptions are intended to be illustrative, not limitative. Thus, it will be apparent to one skilled in the art that certain modifications may be made to the invention as described above without departing from the scope of the claims set out below.

We claim:

1. An output buffer circuit comprising:

an input node adapted to receive an input signal;

an output node adapted to provide an output signal;

means for producing the output signal in response to the input signal comprising:

first current control means for providing current to or from the output node in response to the input signal, second current control means for providing current to or from the output node in response to the input signal; and third current control means for providing current to or from the output node in response to the input signal;

first means for selectably controlling current flow through the means for producing; and means for operably connecting the second and third current control means to the input and output nodes in response to a control signal.

2. An output buffer circuit as in claim 1, wherein each of the first and second current control means comprises an inverter.

3. An output buffer circuit as in claim 2, wherein each of the inverters of the first and second current control means comprises an N-channel transistor and a P-channel transistor connected in series between a supply voltage and a ground voltage.

4. An output buffer circuit as in claim 3, wherein the means for operably connecting the first and/or second current control means to the input and output nodes in response to a control signal comprises:

a first switching transistor connected in series with the N-channel transistor of the first or second current control means between the output node and the ground voltage; and a second switching transistor connected in series with the corresponding P-channel transistor of the first or second current control means between the output node and the supply voltage.

5. An output buffer circuit as in claim 1, wherein the means for selectably controlling current flow controls and/or selects an output signal strength.

6. An output buffer circuit as in claim 1, wherein the first, second and third current control means are connected or connectable in parallel between the input node and the output node.

7. An output buffer circuit as in claim 1, wherein the means for operably connecting the second and third current control means enables an operably connected current control means to provide current to the output node.

8. An output buffer circuit as in claim 1, wherein the means for operably connecting operably connects (i) the second current control means to the input and output nodes in response to a first control signal and (ii) the third current control means to the input and output nodes in response to a second control signal.

9. A system for selectably controlling the drive strength of an output buffer, comprising:

a memory cell; and an output buffer as in claim 2 adapted to receive at the input node an input signal from the memory cell.

10. A system as in claim 9, further comprising means or generating the control signal.

11. A system as in claim 10, wherein the means for generating the control signal comprises means for establishing a voltage of predetermined magnitude.

12. A system as in claim 11, wherein the means for establishing the voltage of predetermined magnitude further comprises a resistor configured to couple a predetermined voltage to the means for selectably controlling.

13. A system as in claim 10, wherein:

the means for generating a control signal comprises means for generating a plurality of signals at a; and the system further comprises means for storing data representing the plurality of signals.

14. A system as in claim 10, wherein:

the means for generating the control signal comprises means for generating a plurality of uniquely identifiable signals; and the system further comprises means for storing data representing the plurality of signals.

15. An output buffer system having a selectable drive strength, comprising:

a packaged integrated circuit, comprising:

a buffer circuit adapted to (i) generate an output signal from an input signal and (ii) receive a control signal, the buffer circuit having a first strength when the control signal is in a first state and a second strength when the control signal is in a second state; and a package lead receiving said control signal; and a strength selector circuit external to said packaged integrated circuit adapted to generate said control signal.

16. A circuit as in claim 15, wherein the buffer circuit comprises:

a first buffer for receiving the input signal;

a second buffer coupled in parallel with the first buffer; and a switch that operably connects the second buffer with at least one current source in response to a predetermined state of the control signal.

17. An output buffer system as in claim 15, wherein the buffer circuit has a third strength when the control signal is in a third state.

18. An output buffer system as in claim 15, wherein the strength selector circuit comprises a switch configured to select from at least two of a first predetermined voltage, a second predetermined voltage, and a default value.

19. An output buffer system as in claim 17, wherein the strength selector circuit further comprises at least one resistor coupled between the switch and a voltage supply.

20. An output buffer circuit as in claim 18, wherein the means for operably connecting operably connects the third current control means to the input and output nodes in response to both the first and second control signals.

* * * * *

UNITED STATES PATENT AND TRADEMARK OFFICE
CERTIFICATE OF CORRECTION

PATENT NO. : 5,864,506　　　　　　　　　　　　　　　　　　Page 1 of 1
DATED　　　 : January 26, 1999
INVENTOR(S) : Arcoleo et al.

It is certified that error appears in the above-identified patent and that said Letters Patent is hereby corrected as shown below:

<u>Title page,</u>
After Item "[22] Filed: Jan. 14, 1998" insert

-- Related U.S. Application Data

[63] Continuation of Ser. No. 08/777, 488, Dec. 30, 1996, Pat. No. 5,732,027. --

<u>Column 1,</u>
Before "BACKGROUND OF THE INVENTION" insert

-- This application is a continuation of U.S. Patent
   Application Serial No. 08/777,488, filed on
   December 30, 1996, now U.S. Patent No. 5,732,027. --

Signed and Sealed this

Fifth Day of February, 2002

*Attest:*

*Attesting Officer*　　　　JAMES E. ROGAN
　　　　　　　　　　　　*Director of the United States Patent and Trademark Office*